(12) United States Patent
Somayazulu

(10) Patent No.: US 6,665,357 B1
(45) Date of Patent: Dec. 16, 2003

(54) SOFT-OUTPUT TURBO CODE DECODER AND OPTIMIZED DECODING METHOD

(75) Inventor: V. Srinivasa Somayazulu, Tigard, OR (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 09/363,303

(22) Filed: Jul. 28, 1999

Related U.S. Application Data (60) Provisional application No. 60/116,765, filed on Jan. 22, 1999.

(51) Int. Cl.[7] ................................................. H03D 1/00
(52) U.S. Cl. ...................................................... 375/341
(58) Field of Search ............................... 375/265, 262, 375/341, 340, 324; 714/746, 752, 753, 755, 758, 759, 780, 795, 794

(56) References Cited

U.S. PATENT DOCUMENTS

| | | | | |
|---|---|---|---|---|
| 5,181,209 | A | | 1/1993 | Hagenauer et al. ............ 371/43 |
| 5,361,276 | A | | 11/1994 | Subramanian |
| 5,721,745 | A | * | 2/1998 | Hladik et al. ................. 714/755 |
| 5,822,602 | A | * | 10/1998 | Thusoo ............................ 712/1 |
| 5,983,384 | A | * | 11/1999 | Ross .............................. 714/755 |
| 6,023,783 | A | * | 2/2000 | Divsalar et al. ............. 375/262 |
| 6,044,116 | A | * | 3/2000 | Wang ............................. 375/265 |
| 6,182,261 | B1 | * | 1/2001 | Haller et al. ................. 714/758 |
| 6,233,709 | B1 | * | 5/2001 | Zhang et al. ................. 714/774 |
| 6,304,995 | B1 | * | 10/2001 | Smith et al. .................. 714/786 |
| 6,339,834 | B1 | * | 1/2002 | Crozier et al. .............. 714/701 |
| 6,370,669 | B1 | * | 4/2002 | Eroz et al. ..................... 714/774 |
| 6,377,610 | B1 | * | 4/2002 | Hagenauer et al. .......... 375/136 |
| 6,510,536 | B1 | * | 1/2003 | Crozier et al. ............... 714/755 |

OTHER PUBLICATIONS

Peter Eck, 21.06.97, *Institute for Communications Engineering*.
S. Benedetto; D. Divsalar, G. Montorsi, F. Pollara;*Parallel Concatenated Trellis Coded Modulation*. Jet Propulsion Laboratory, California Institute of Technology, Pasadena, California. Five pages.
Blackert & Wilson, Communications Systems Laboratory, Department of Electrical Engineering, University of Virginai, Charlottesville, Virginia. Six pages.
Ryan, *A Turbo Code Tutorial*, New Mexico State University, Las Cruces New Mexico. Nine pages.
*Properties of Convolutional Codes*; Chapter 6, Part 2, *Channel Coding*. pp. 314–349.

(List continued on next page.)

*Primary Examiner*—Emmanuel Bayard
(74) *Attorney, Agent, or Firm*—Chernoff Vilhauer McClung & Stenzel, LLP (57) ABSTRACT

Turbo codes used in digital communication systems are decoded by successive iterations of a maximum likelihood algorithm. The turbo code decoder is a modular apparatus with each module comprising two or more serial constituent decoders. The output a constituent decoder or a module is part of the input to the next constituent decoder or module, respectively. The progress of the decoding can be monitored by establishing a limit for the output of the constituent decoders and monitoring the numbers of outputs of one or more constituent decoders that approximately equaling that limit. When the numbers of outputs approaching the limit or saturating is unchanged for successive iterations or successive serial decoders no further progress is being made in decoding the message. The performance of the turbo code decoder can be optimized by terminating iterations of the decoding process when the numbers of constituent decoder outputs that have saturated is unchanged for successive iterations or decoder operations.

18 Claims, 5 Drawing Sheets

OTHER PUBLICATIONS

Kenny Chan; *Turbo Code Project Page*. Dec. 21, 1997.

V.K. Bhargava & I.J. Fair, *Forward Error Correction Coding*, University of Victoria, pp. 166–179.

Chapter 16: *Forward Error Correction Techniques*, pp. 1387–1409.

Department of Electrical and Electronic Engineering, Hong Kong University of Science & Technology, Clear Water Bay, Kowloon, Hong Kong; *Improvements in Sova–based Decoding for Turbo Codes*; Lang Lin, Roger S. Cheng, Aug. of 1997; pp. 14731478.

Hagenauer, Joachim and Hoeher, Peter, "A Viterbi Algorithm with Soft–Decision Outputs and its Applications," German Aerospace Research Establishment (DLR), Institute for Communications Technology, 1989, pp. 1680–1686, IEEE, Oberpfaffenhofenm, West–Germany.

Joachim Hagenauer, Fellow, IEEE, Elke Offer, and Lutz Papke, "Iterative Decoding of Binary Block and Convolutional Codes," IEEE Transactions on Information Theory, vol. 42, No. 2, Mar. 1996, pp. 429–437, IEEE, Germany.

Lang Lin and Roger S. Cheng, "Improvements in SOVA–Based Decoding For Turbo Codes," Department of Electrical and Electronic Engineering, Hong Kon University of Science & Technology, 1997, pp. 1473–1478, IEEE, Clear Water Bay, Kowloon, Hong Kong.

Gong, K. S. et al, "A Frequency Tracking Rake Demodulator For Multipath Channels," Proceedings of the Military Communications Conference (MILCOM), IEEE, vol. 30, Sep. 1990, New York, pp 1020–1024.

Bauch et al., Iterative Equalization and Decoding in Mobile Communication Systems, Proceedings of European Personal and Mobile Communications Conference, Sep. 30, 1997, pp. 308–312.

Shao et al., Two Simple Stopping Criteria for Turbo Decoding, IEEE Transactions on Communications, IEEE, 08–99, vol. 47, No. 8, pp. 1117–1120, New York, NY.

Chang, Parallel Decoding of Turbo Codes, Electronics Letters, IEEE, Jun. 20, 1996, vol. 32, No. 13, Stevenage, UK.

Chang, Q–ary Turbo Codes with QAM Modulations, Proceedings of ICUPC, 5th International Conference on Universal Personal Communications, Sep. 29, 1996, vol. 21, pp. 814–817, Cambridge, MA.

* cited by examiner

SOFT-OUTPUT TURBO CODE DECODER AND OPTIMIZED DECODING METHOD

This application claims the benefit of U.S. patent application Ser. No. 60/116,765, filed on Jan. 22, 1999.

BACKGROUND OF THE INVENTION

The present invention relates to channel coding for digital communications systems and, more particularly, to a turbo code decoder useful for channel coding and a method for optimizing the performance of a turbo code decoder.

Forward error correction (FEC) is a system of error control for data transmission systems where the receiver is capable of detecting and correcting errors in the "as received" message induced by noise in the transmission channel. FEC is useful in connection with data transmission systems which lack a reverse channel with which retransmission of data can be requested or where retransmission would be difficult because the delay would be excessive or repeated retransmission would be required because of the number of expected errors. For these reasons, FEC has been of particular interest and use in wireless communication and space probe and satellite data transmission systems. FEC relies on channel coding where input message sequences are mapped to code symbol sequences that add redundancy and memory to the data before transmission.

Generally, channel coding utilizes block or convolutional coding to add redundancy to the message bit stream. Block coding breaks the bit stream representing the message into fixed size blocks and independently adds redundant code symbols to each block. Block coding is usually decoded with algebraic techniques. On the other hand, convolutional coding continuously adds redundant symbols to the bit stream based on the contents of the stream. In the convolutional encoder, the bits of the message are shifted serially into and out of a shift register having a number of individual registers. The output code is the result of modulo arithmetic performed on the contents of the shift register and, in some cases, the input bit stream as each successive message symbol or bit is shifted into the register. While bit stream segmentation is not required for convolutional coding, the coded bit stream is typically broken into blocks or frames for other reasons before transmission. Decoding of convolutional codes is accomplished with a heuristic or trial-and-error approach.

Turbo codes are produced by encoders comprising two, or more, parallel, constituent encoders. The constituent encoders are often, but not necessarily, identical convolutional encoders. An interleaver or permuter is attached to the input of one or more of the constituent encoders. The interleaver rearranges the input of the attached constituent encoder in a systematic, pseudo-random manner. As a result, turbo codes comprise two or more (depending on the number of encoders) independently coded symbol streams that refer to the same input information bit stream. Turbo codes are of particular interest because with a relatively simple constituent code and large interleaver their performance can be near the theoretical or Shannon limit of the transmission channel.

Turbo code decoding is an iterative process with the results of a first modular decoder forming part of the input to a second modular decoder and so forth until the required number of iterations is achieved. When the turbo code is composed of two parallel concatenated codes, the modular turbo code decoder comprises two serially connected constituent decoders separated by an interleaver that reorders the output of the first decoder so that it may be used as input to the next decoder. Decoders for turbo codes with more than two parallel constituent codes may take a number of forms. A convolutional encoder is a state machine that codes by tracing a path through a code tree or trellis on the basis of the sequence of input symbols. From the symbols of the "as received," coded message the convolutional code decoder attempts to retrace the encoder's path through the code tree or trellis outputting the symbols of the decoded message while correcting errors incurred in transmission. One technique for decoding convolutional codes relies on algorithms which retrace the path of "maximum likelihood" through the trellis. One such "maximum likelihood" algorithm used in turbo code decoding is the soft output Viterbi algorithm (SOVA). A constituent decoder applying the SOVA algorithm computes or estimates the "log likelihood ratio," the logarithm of the ratio of the conditional probabilities of receiving the two outcomes (binary "1" and "0") given the observed signal value. The output of the constituent decoder is a plurality of signed numbers. The sign expresses the polarity of the decoded message symbol. The magnitude is a "soft" or analog value expressing the probability that the decoded symbol is the same as the original message symbol.

Generally, the turbo code decoder converges on a final decoded symbol sequence with successive iterations and the error rate performance improves until a threshold number of iterations is reached. While the error rate performance of the decoder generally improves with additional iterations, the rate of improvement decreases. Each iteration takes time further delaying completion of decoding. Heretofore, the number of iterations to be performed by a particular turbo code decoder was hard wired into the decoder. Optimizing the number of iterations to be hardwired into the decoder involves compromises in the error rate and latency of the decoder's performance. Further, due to the random nature of noise, "as received" data sequences are unequally corrupted and require different numbers of iterations to achieve the same level of error correction.

What is desired, therefore, is a turbo code decoder and a method of decoding that optimize the performance of the decoder producing a given level of error correction in the fewest number of decoding iterations on the average. Further, it is desired that the operation of the decoder be responsive to the error correcting requirements of each message. Optimizing the decoding process reduces the latency in decoding a message at an acceptable error rate and reduces the cost and complexity of the decoder.

SUMMARY OF THE INVENTION

The present invention overcomes the aforementioned drawbacks of the prior art by providing a method of optimizing the performance of an iterating turbo code decoder having a plurality of constituent decoders comprising the steps of establishing a limit for an output of a constituent decoder; determining the number of decoder outputs approximately equaling the limit for each of successive iterations by the turbo code decoder; and terminating operation of the turbo code decoder when the numbers of the decoder outputs approximately equaling the limit are substantially unchanged for successive iterations. The progress of a turbo code decoder in decoding a message sequence can be monitored by establishing a limit for the output of a constituent decoder and monitoring the number of outputs of equaling or approaching the limit. If the number of outputs approaching the limit or saturating does not change for successive iterations by the turbo code decoder, no progress is being made in decoding the message. Operation of the turbo code decoder can be terminated without loss of data.

A second technique applying the method of optimizing the performance of an iterating turbo code decoder including a plurality of serial constituent decoders comprises establishing a limit for an output of a constituent decoder; determining a first and a second number of the outputs approximately equaling the limit produced by the second serial constituent decoder while performing a first iteration and a second iteration, respectively; determining a third number of the outputs approximately equaling the limit produced by the first serial constituent decoder while performing the second iteration; and terminating operation of the turbo code decoder when the first, second, and third numbers of outputs are substantially equal.

A third technique for applying the method of optimizing the performance of an iterating turbo code decoder including a plurality of serial constituent decoders comprises establishing a limit for an output of a constituent decoder; determining a first number of outputs produced by the first serial constituent decoder performing an iteration approximately equaling the limit; determining a second number of outputs produced the last serial constituent decoder performing the iteration approximately equaling the limit; and terminating operation of the turbo code decoder when the first and second numbers of outputs are substantially equal.

In a fourth technique of applying the method of optimizing the performance of an iterating turbo code decoder including a plurality of serial constituent decoders comprises establishing a limit for an output of a constituent decoder; and terminating operation of the turbo code decoder when substantially all outputs produced by the constituent decoder while performing an iteration are approximately equal to the limit. By monitoring the progress of the decoding process and terminating decoding iterations when progress slows or stops, the delay in decoding any particular message stream can be minimized while achieving a satisfactory error rate for any "as received" symbol sequence.

An optimized iterating turbo code decoder is also provided comprising a plurality of serial constituent decoders; a comparator to compare a plurality of outputs of a constituent decoder to a threshold value for the output, a counter to count the number of the outputs produced by the constituent decoder approximately equaling the threshold value; and a decision unit to terminate operation of the turbo code decoder when the number of the outputs approximately equaling the threshold value is unchanged for successive iterations. In a second embodiment of the optimized turbo code decoder, the number of outputs of the first and last of the serial constituent decoders that have saturated during an iteration is compared to determine progress in decoding. In a third embodiment, the number of outputs of the first serial constituent decoder performing a first iteration and the numbers of outputs of the last serial constituent decoder performing the first and a subsequent iteration are compared to determine decoding progress and whether further iterations are warranted.

The foregoing and other objectives, features and advantages of the invention will be more readily understood upon consideration of the following detailed description of the invention, taken in conjunction with the accompanying drawings.

DETAILED DESCRIPTION OF THE PREFERRED EMBODIMENT

Figure 1:
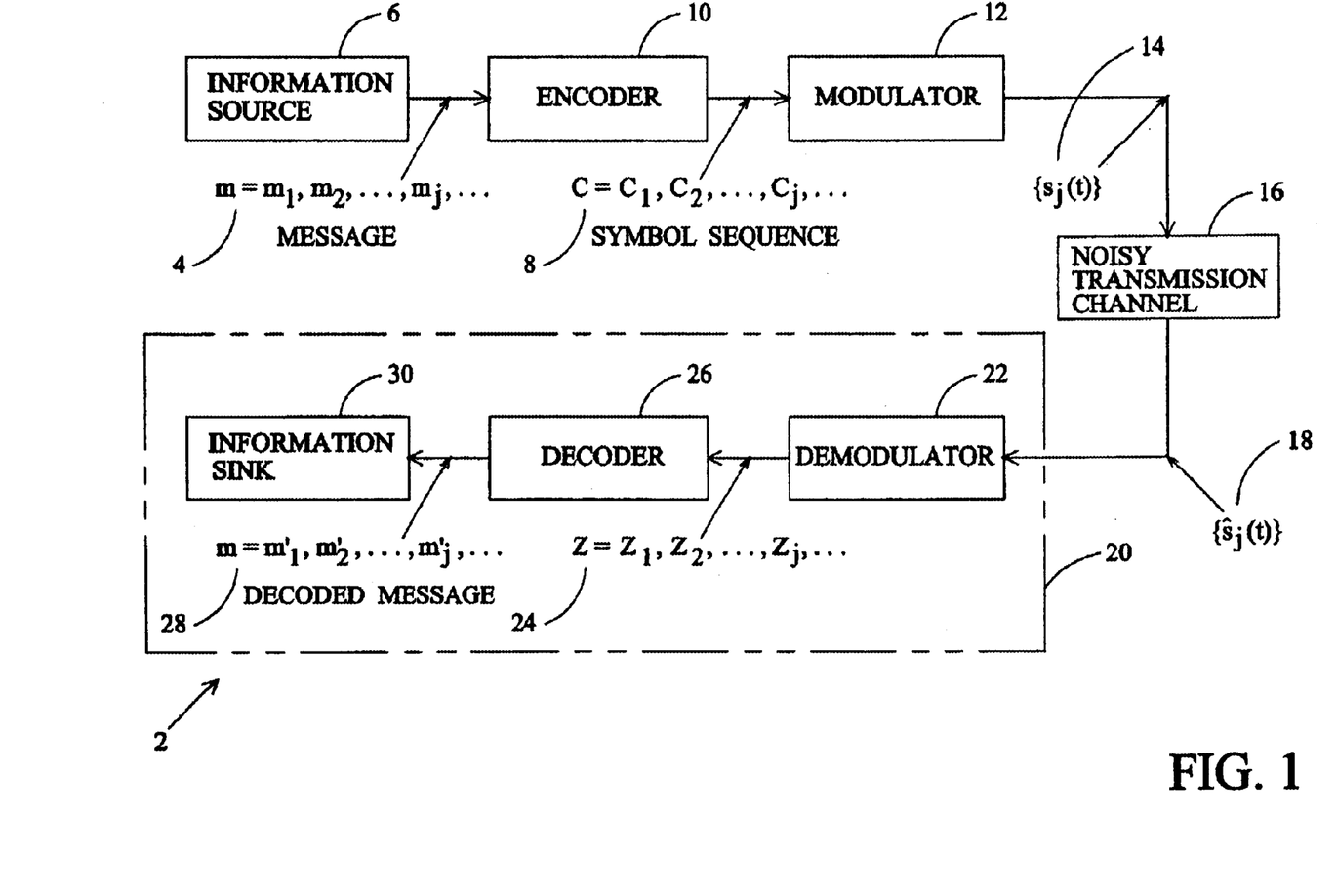
FIG. 1 is a block diagram of a communication link incorporating channel coding.

Referring to FIG. 1, forward error correction (FEC) is used to detect and correct errors which can occur in digital messages as a result of noise in a communication link 2. A message 4 comprising a sequence of bits or symbols ($m_1$, $m_2$, ... $m_i$, ...) originates with an information source 6. If the communications link 2 incorporates FEC, the message sequence 4 is encoded before transmission to a code symbol sequence 8, ($C_1$, $C_2$, ... $C_i$, ...) by an encoder 10. The codeword sequence 8 is forwarded to a modulator 12 where it is converted to signals 14 ($\{s_i(t)\}$) which are suitable for the transmission in the channel 16 of the communication link 2. The transmission channel 16 may be affected by noise resulting in a distorted-signal 18 ($\{\hat{s}_i(t)\}$) at the receiver 20. In the receiver 20, a demodulator 22 converts the signal with any distortion incurred during transmission into a demodulated bit stream 24 ($Z_1$, $Z_2$, ... $Z_i$, ...). The demodulated bit stream 24 is then decoded by a decoder 26 which identifies and corrects errors in the "as received" message to produce a corrected, decoded output message stream 28 ($m'_1$, $m'_2$, ... $m'_i$, ...). The output message is passed to an information sink 30 for consumption.

Several channel coding techniques are used for FEC in communication systems. One technique, which is thought to achieve performance near the theoretical or Shannon limit of the transmission channel, is turbo coding. Turbo codes are interleaved, parallel concatenated, codes. The constituent codes are often convolutional codes but may be codes produced by other techniques.

Figure 2:
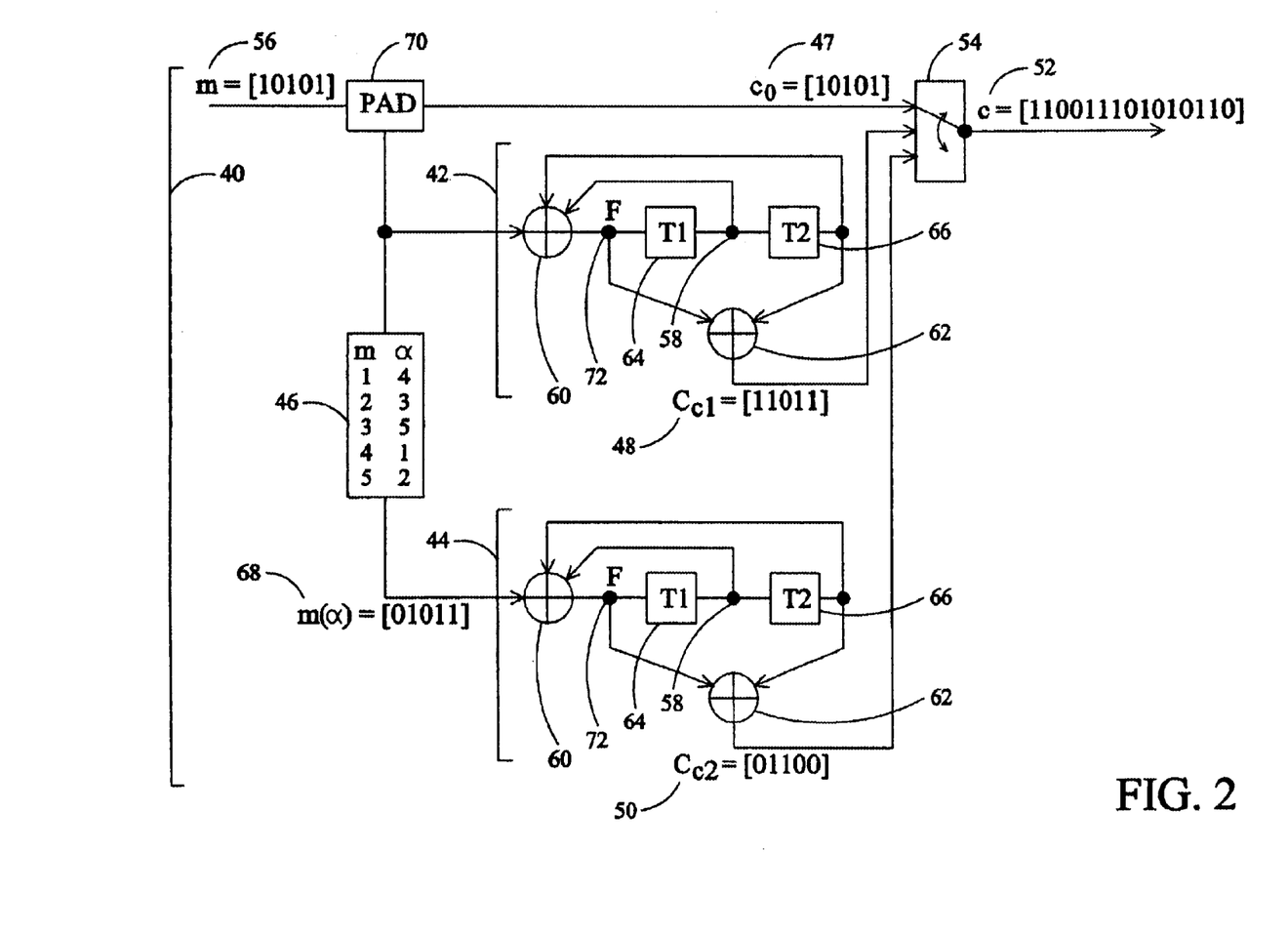
FIG. 2 is a block diagram of an exemplary systematic, recursive convolutional encoder.

Referring to FIG. 2, an exemplary turbo-code encoder 40 (indicated by a bracket) comprises two parallel, recursive, systematic, convolutional, constituent encoders 42 and 44 (indicated by brackets) with an interleaver 46 attached to the input of one of the encoders 44. Turbo code encoders may have more than two parallel constituent encoders with additional interleavers attached to the inputs of the additional constituent encoders. The turbo code encoder 40 has three intermediate outputs ($c_0$) 47, ($c_{C1}$) 48, and ($c_{C2}$) 50 which are combined into a coded serial bit stream (C) 52 by an output multiplexer 54. The code rate of the turbo code encoder 40 or the ratio of the number of input message symbols (m) to the number of output code symbols (C) is 1/3.

The turbo code encoder 40 is a systematic encoder with the symbols of the input message or frame (m) 56 constituting one of encoder's intermediate outputs ($c_0$) 47. The intermediate outputs ($c_{C1}$) 48 and ($c_{C2}$) 50 are the outputs of the first 42 and second 44 constituent convolutional encoders, respectively. The first 42 and second 44 constituent convolutional encoders each comprise a shift register 58 and a pair of modulo-2 adders 60 and 62. The shift registers 58 of the illustrated encoders have two individual registers; (T1) 64 and (T2) 66. The symbols of an input bit stream for the constituent encoders 42 and 44, ($m_i$) 56 or $(m(\alpha)_i)$ 68, respectively, are shifted one bit at a time into the shift register 58. To ensure that the contents of the shift registers 58 are known at the start of the message and that all of the message bits are shifted completely through each shift register 58, the turbo code encoder includes a padding unit 70 to add sufficient bits (usually zeroes) to "flush" the shift register to a known state at the end of the message or frame. A convolutional encoder adds redundant bits to the message on a continuous basis so that the entire message is one code. However, the coded message data is often segmented into fixed length frames for transmission.

In the turbo code encoder 40 the input of the first constituent convolutional encoder 42 is the exemplary message sequence (m) 56 [10101]. In the recursive convolutional encoders 42 and 44, the modulo-2 sum of the input bit and the contents of the two registers (T1) 64 and (T2) 66 is computed in a modulo-2 adder 60 to create a feedback bit 72 (F). The output of the constituent convolutional encoder, ($c_{C1}$) 48 or ($c_{C2}$) 50, is the modulo-2 sum of the feedback bit 72 (F) and the contents of the T2 register 66 computed in the adder 62. The output of the first constituent convolutional encoder ($c_{C1}$) 42 is the coded bit stream: [11011].

The input (m($\alpha$)) 68 of the second constituent convolutional encoder 44 is the message sequence (m) 56 as rearranged by an interleaver 46. Interleaving rearranges the input symbols in some pseudo-random manner so that the multiple code symbols representing each input symbol will be separated from each other in the output bit stream (C) 52. The error correcting performance turbo codes is due, in part, to the use of large turbo interleavers that interleave hundreds bits. Interleaving results in two or more (depending on the number of constituent codes) independently coded symbol streams that refer to the same message bit stream. Turbo code decoders exploit this structure of the code to derive extrinsic information about bits in one symbol stream from the bits in the remaining stream(s) and use this information to estimate the correctly decoded symbols. The estimates are refined during successive iterations of the decoding process.

In the exemplary interleaver 46 the input symbols are rearranged according to a table where the first bit of the input sequence: ($m_1$) becomes the fourth bit (m($\alpha$)$_4$) of the convolutional encoder input sequence 68; the second input bit ($m_2$) becomes the third bit (m($\alpha$)$_3$) and so forth. As a result, the output ($c_{C2}$) 50 of the second convolutional encoder 44 is different from that of the first constituent encoder 42 even though the encoding process within the encoder is the same. Further, as a result of interleaving, the three coded output symbols representing any input message symbol are separated in the output bit stream 52.

Figure 3:
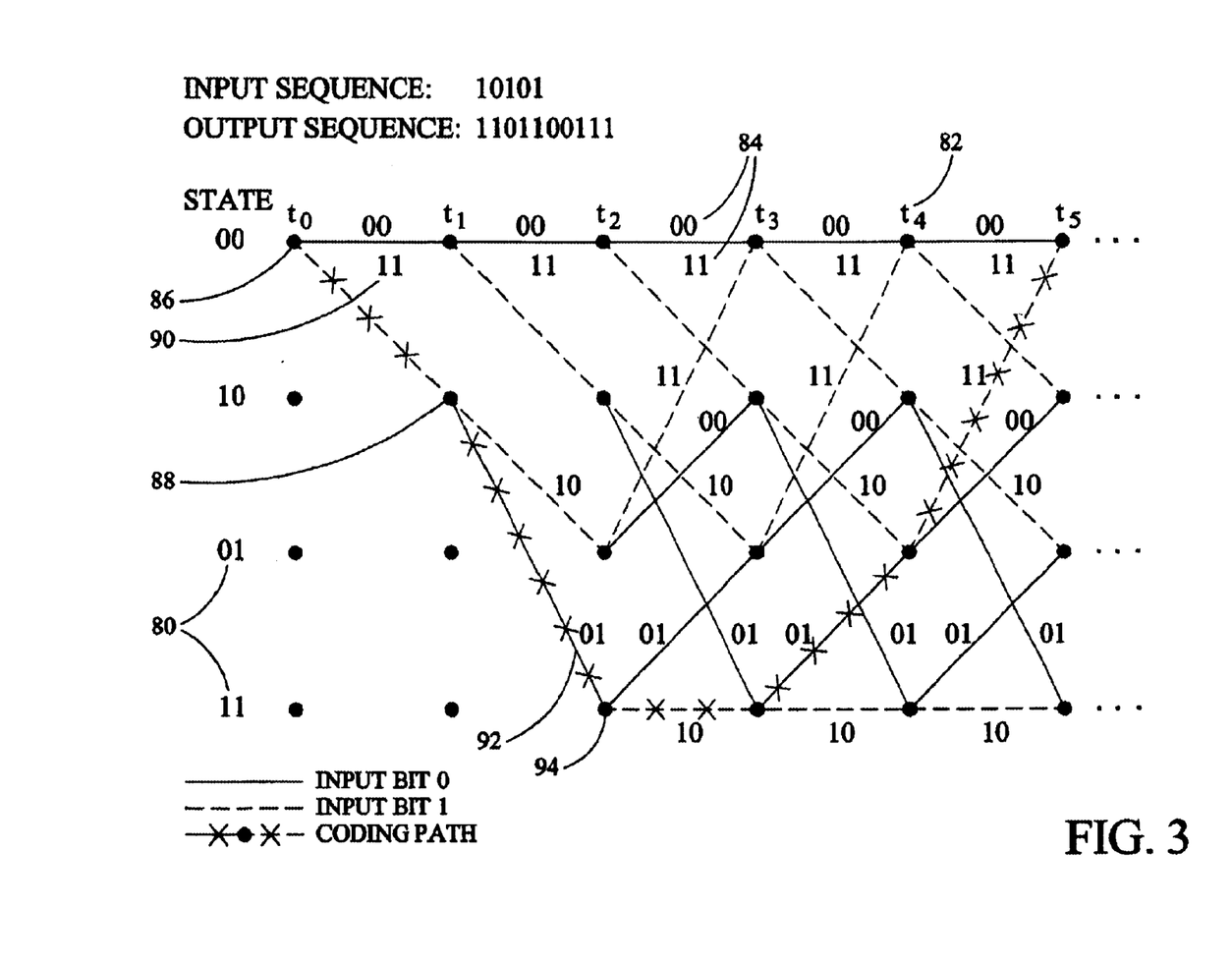
FIG. 3 is a trellis diagram of the operation of a recursive, constituent convolutional encoder of the encoder of FIG. 2.

A convolutional encoder is a state machine and its operation can be represented by a path traced through a code tree or a trellis diagram. FIG. 3 is a trellis diagram illustrating an exemplary operation of the constituent recursive convolutional encoder 42 of FIG. 2. Each node 80 of the trellis corresponds to a state of the shift register of the encoder 42 (listed vertically to the left of the trellis) at an input time or coding stage 82 ($t_0$, $t_1$, ...) (indicated horizontally across the top of the trellis). Two paths exit each node of the trellis. The path to be followed to the next state at the next stage of encoding is determined by the message bit causing the state transition. An input message bit (1) causes the encoder to follow the path represented by a dashed line and an input message bit (0) causes the encoder to follow the path represented by a solid line. An output code symbol 84 for each path is shown adjacent to the path. For example, at $t_1$ a bit (1) is shifted into the encoder 42 causing the encoder to transition from the an intial state (00) 86 (as a result of padding) to the next state (10) 88. When the encoder exits the first node (00) 86 for the next state (10) 88, it exits on the path corresponding to the input bit (1) (dashed line) which causes the encoder to output a code symbol (11) 90 Likewise, the next message bit (0) determines the exit path from the second node (state 10 at $t_1$) 88 producing the next code symbol (01) 92 and causing the encoder to move to its next state (11 at $t_2$) 94. It is desirable for the encoder to start and end in an all zero state. For an input sequence [101] two extra bits [01] are necessary to produce a zero ending state. Following the path through the trellis for an input message sequence [101] plus two padding bits [01], produces the output code: [1101100111]. The output of the encoder of FIG. 2 is the output constituent encoders (the trellis diagrams for each of the two encoders) which is multiplexed with the original message symbols.

Figure 4:
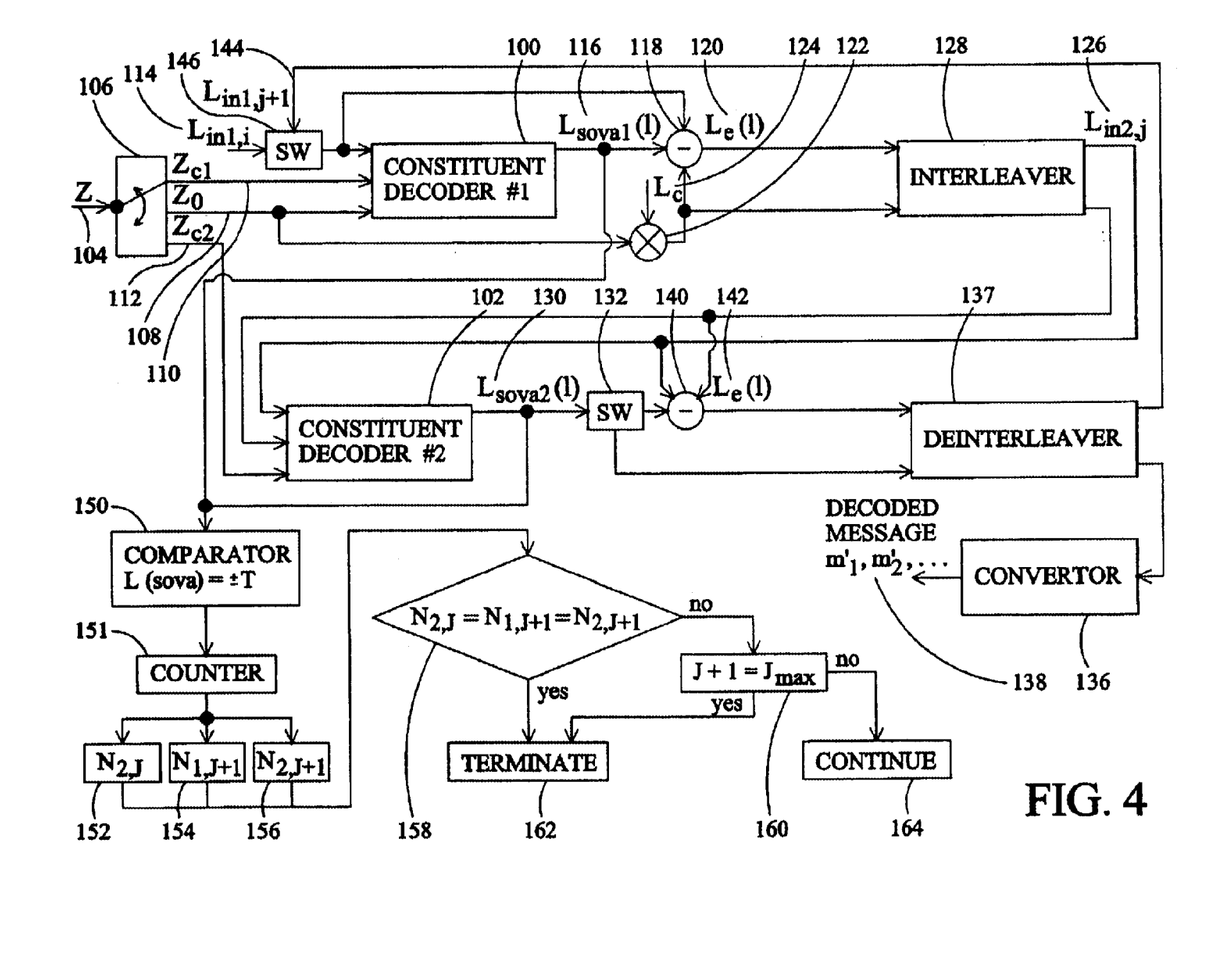
FIG. 4 is a block diagram of a turbo code decoder according to the present invention.

Turbo code decoding is an iterative process and the turbo code decoder is modular in nature with the output of a first module (the result of a first iteration) being the part of the input to a first decoder of the next modular decoder for use in the next iteration of the process. Referring to FIG. 4, an exemplary modular turbo code decoder includes a number of serially connected, constituent decoders 100 and 102 equal to the number constituent encoders in the particular turbo code encoder. Other arrangements of the decoder are possible if the number of constituent codes is greater than two, but the present invention may be utilized with these other arrangements, as well. The "as received" coded transmission (Z) 104, including any errors incurred in transmission, is received by the decoder from the demodulator 22. In an input demultiplexer 106, the "as received" data stream (Z) 104 is separated into three constituent streams; ($z_0$) 108, ($z_{C1}$) 110, and ($z_{C2}$) 112 representing the "as received" versions of the three intermediate outputs of the encoder; ($c_0$) 47, ($c_{C1}$) 48, and ($c_{C2}$) 50.

Figure 5:
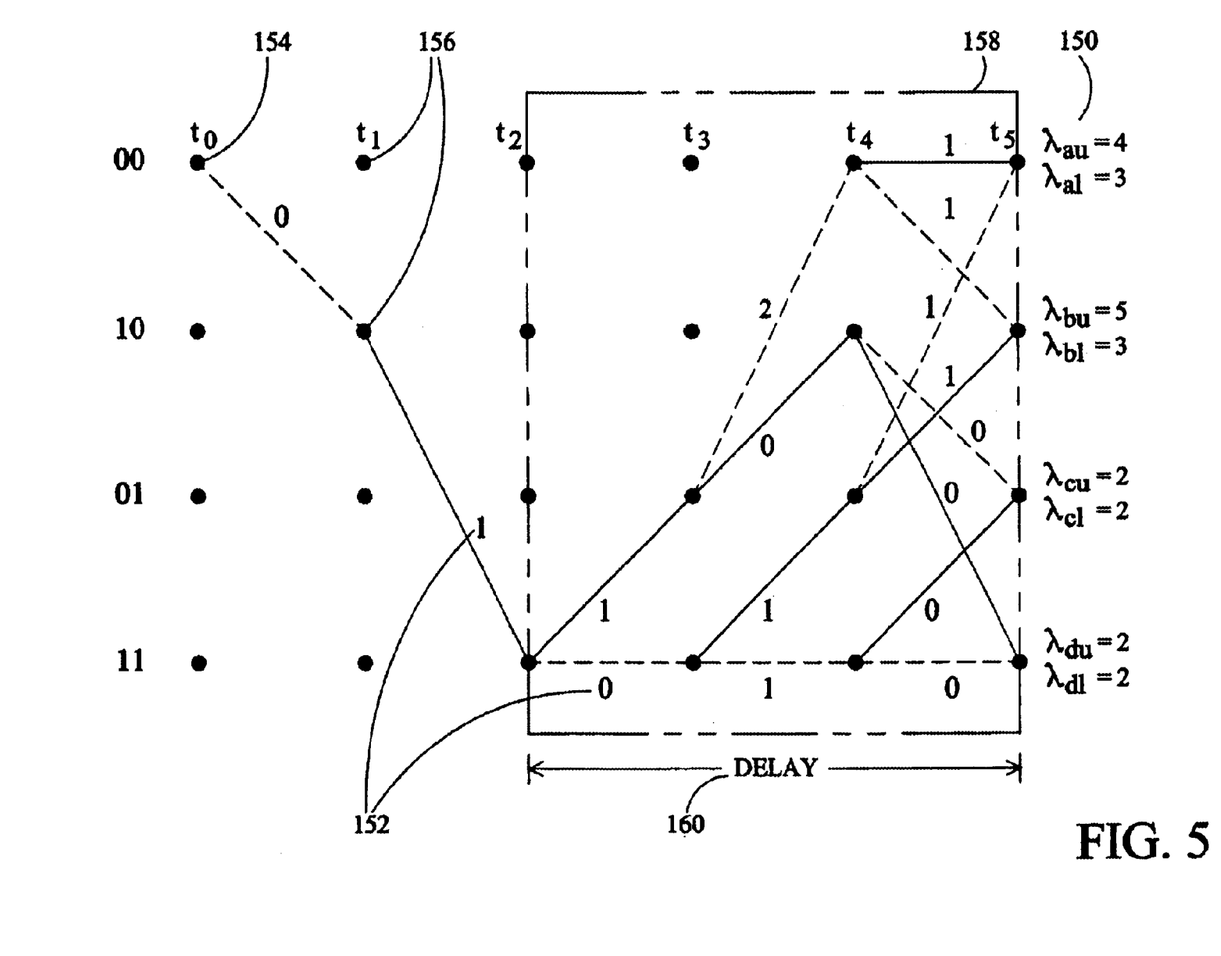
FIG. 5 is trellis diagram for a soft output Viterbi algorithm based, constituent, convolutional decoder.

In the constituent decoders 100 and 102, the soft output Viterbi algorithm (SOVA) is used to retrace the "most likely" path followed by the encoder through the trellis diagram when it produced the encoded message. Referring to FIG. 5, in applying the Viterbi algorithm the decoder operates serially through the stages. At each stage, a path metric 150 is computed for paths from the initial state to all possible states for that stage. The path metric 150 is the accumulated difference metric 152 along each path from the decoder's initial state 154 to each node 156 at the particular stage. The difference metric 152 for a path between two nodes represents a measure of the difference between a code word of the received message and the corresponding code word which the encoder would have generated in making the transition between those two nodes or states. According to the Viterbi algorithm, the "most likely" path followed by the encoder in coding the sequence is the path with the least path metric. This path is retained for use at the next input stage and the path with the greater path metric is discarded. As the algorithm is applied for input stages further and further into the trellis, a single "most likely" path emerges after a delay 160. There is a high probability that errors in the received message will be eliminated and that the message will be correctly decoded by following this path through the trellis diagram.

A modified Viterbi algorithm (the soft output Viterbi algorithm or SOVA) is used in turbo code decoders to produce "soft" or analog outputs from soft or hard inputs. "Soft" inputs and outputs quantize the level of the actual signal (often at eight levels) between the possible a binary values of the signal. The "soft" value represents the reliability of the signal's value as well as its polarity.

There are two basic steps in the SOVA algorithm used in the constituent decoders of the turbo code decoder. The first or Viterbi step is similar to the Viterbi algorithm with the addition of the computation of the maximum path metric differences for each node at each stage of the trellis. In the second or update step, a window 158 is established corresponding to the delay of the Viterbi algorithm in converging on a single path. The window 158 slides along the trellis as the decoder moves from stage to stage. The minimum path metric difference is found from among all possible paths in this window that compete with the survivor path and would have led to a different bit decision than the survivor path. This minimum path metric difference is given a sign based on the hard value of the current bit and is the soft value of the SOVA output. The output of a constituent convolutional decoder applying the SOVA algorithm comprises a signed number for each decoded bit of the message. The sign of the number (the sign of the "log likelihood ratio") represents the value or polarity of the bit. The magnitude of the number represents the reliability of its proper decoding (the magnitude of the "log likelihood ratio").

With the SOVA algorithm, the path metric computations of the Viterbi algorithm are augmented by the addition of a term which incorporates extrinsic information (Lin(t)) supplied by the previous constituent decoder. For each state (k) at a particular t in the trellis, the path metric $M_{k,t}$ is computed by extending the path metrics from all states (k'), at time t-1, with valid transitions to a state k, at time t, as follows:

$$M_{k,t} = \max_{k'} \left\{ M_{k',t-1} + 1/2 \sum_{v=1}^{N} Lc\, y_{v,t} x_{v,k',k} + 1/2 L_{in}(t) \right\}$$

where: Lin(t) is the extrinsic information from the previous decoder, and

Lc is a channel reliability factor equal to:
Lc=4 a $Es/N_0$
where: a=the fading amplitude of the channel; and
$Es/N_0$=signal to noise ratio for the channel.

Referring to FIG. 4, the first constituent decoder 100 applies the SOVA algorithm to the systematic data ($Z_0$) 110, the coded data from the first encoder ($Z_{C1}$) 108, and initial a-priori information ($L_{in1,i}$) 114 to compute a soft output (L(soval) 116 comprising a plurality of signed numbers each representing the value of a decoded message bit and the probability that the value has been correctly decoded. The extrinsic information (L(e)) 120 is produced by subtracting the product of systematic data ($Z_0$) 110 and the channel reliability factor (Lc) 124 produced in the multiplier 122 and the a-priori information ($L_{in1,i}$) 114 from the decoder output (L(sova)) 116 in a subtraction unit 118. After interleaving the extrinsic information (L(e)) 120 becomes a-priori information (Lin2,j) 126 which is supplied to the second constituent decoder 102.

The input data for the second constituent decoder 102 comprises the interleaved version of a-priori information (Lin2,2j) 126 from the first constituent decoder 100, the systematic data ($Z_0$) 110 which has also been interleaved in the interleaver 128, and the "as received" coded output of the second encoder of the turbo code encoder ($Z_{C2}$) 112 which has been separated from the input message bit stream, (Z) 104 by the input demultiplexer 106. The second constituent decoder 102 applies the SOVA algorithm to this second coded information and produces a second soft output (Lsova2) 130, completing an iteration of the decoding process.

If the required number of iterations have been completed, the soft output of the second decoder (Lsova) 130 is diverted by switch 132 to the deinterleaver 134 and passed to an conversion unit 136 where "hard" (binary) values are selected for the decoded message 138 from the "soft" (analog) values of the decoder output.

If the required number of iterations has not been completed, the interleaved intrinsic information (Lin2,j) and the interleaved systematic data ($Z_0$) 110 from the input to the second decoder 102 is subtracted from the soft output of the second decoder (Lsova2) 130 in the subtraction unit 140. The resulting extrinsic information (Le) 142 is an interleaved version of the intrinsic information (Lin1,j+1) 144. After deinterleaving in the deinterleaver 134, this intrinsic information (Lin1,j+1) 144 is fed back through the switch 146 to the input to the first constituent decoder 100 for the next successive iteration of the decoding process.

The output of the SOVA algorithm depends upon the value of the minimum of the maximum path metric differences in the update window along the survivor path. For low signal to noise ratios (SNR) the maximum path metric differences are likely to be small. For high SNR, the path metric differences are likely to be large resulting in large values of the SOVA output (Lsova). These large values have a negative effect on the convergence of the algorithm and the performance of the algorithm can be improved by limiting the output (Lsova).

The present inventor came to unexpected realization that the convergence of the SOVA algorithm can be monitored by comparing the number of outputs of the constituent decoders that are saturating at a limiting level at each iteration and discontinuing iteration when this number does not change from iteration to iteration. Further, the decision to continue iterating can be made by comparing the change in the number of saturating outputs produced by each of the individual constituent decoders in a single iteration.

In the present invention, the outputs (L(sova)) are directed from the constituent decoders 100 and 102 to a comparator 150 which compares each output to a threshold or limit (T). The numbers of L(sova) outputs from the second constituent decoder 102 (L(sova2)) for a first iteration (N2,j) and a successive iteration (N2, j+1) and from the first constituent decoder 100 for the successive iteration (N1,j+1) equaling the threshold (T) are counted by the counter 151 and stored in memory 152, 154, and 156. The three numbers of saturated L(sova) values are compared in a decision unit 158. If the three numbers are approximately equal, the algorithm can be declared to have converged and the operation of the turbo code decoder can be terminated 162 without loss of information. If the three numbers are not equal, the algorithm is continuing to converge and the turbo code decoder will be allowed to continue 164 to operate unless the maximum number of iterations 160 has been reached. A second technique and apparatus stores and compares the numbers of outputs of the first and second constituent decoders which have saturated in successive iterations. When the numbers of saturating outputs do not in succeeding iteration does not change convergence is declared and operation of the decoder is halted. Likewise, the saturating outputs of a single constituent decoder can monitored for successive iterations until there is little or no further change in the numbers of saturating outputs. A fourth, less complex technique is to compare the output of the last serial constituent decoder with the output of the first serial constituent decoder performing one iteration. While the convergence of the algorithm is indicated by a lack of change in the number of saturated outputs produced by the first and last decoders performing a single iteration, there is less certainty of the effect of continuing operation using this method. If all of the values in the SOVA outputs of the constituent decoders have saturated the algorithm has converged and operation may be terminated. The threshold (T) and the L(sova) value are both signed values. The number of comparisons may be reduced by 50% by comparing outputs of only one sign with threshold having the same sign.

The terms and expressions that have been employed in the foregoing specification are used as terms of description and not of limitation, and there is no intention, in the use of such terms and expressions, of excluding equivalents of the features shown and described or portions thereof, it being recognized that the scope of the invention is defined and limited only by the claims that follow.

What is claimed is:

1. A method of optimizing the performance of an iterating turbo code decoder including a plurality of constituent decoders, said method comprising the steps of:

(a) establishing a limit for an output for each of said constituent decoders;

(b) determining a number of outputs approximately equaling said limit for successive iterations by said turbo code decoder; and (c) terminating operation of said turbo code decoder when said number of said outputs is substantially unchanged for successive iterations.

2. The method of claim 1 wherein said limit has a sign and where said number of said outputs approximately equaling said limit is the number of said outputs having a sign approximately equal to that of said limit.

3. The method of claim 1 wherein a one of said constituent decoders applies a soft output Viterbi algorithm.

4. A method of optimizing the performance of an iterating turbo code decoder including a plurality of serial constituent decoders, said method comprising the steps of:

(a) establishing a limit for an output for at least one of said serial constituent decoders;

(b) determining a first and a second number of said outputs approximately equaling said limit produced by a second one of said serial constituent decoders while performing a first iteration and a second iteration, respectively;

(c) determining a third number of said outputs approximately equaling said limit produced by a first one of said serial constituent decoders while performing said second iteration; and (d) terminating operation of said turbo code decoder when said first, second, and third numbers of said outputs are substantially equal.

5. The method of claim 4 wherein said limit has a sign and where said first, second, and third numbers of said outputs are numbers of said outputs having a sign approximately equal to that of said limit.

6. The method of claim 4 wherein one of said constituent decoders applies a soft output Viterbi algorithm.

7. A method of optimizing the performance of an iterating turbo code decoder including a plurality of serial constituent decoders, said method comprising the steps of:

(a) establishing a limit for an output for one of said constituent decoders; and (b) terminating operation of said turbo code decoder when substantially all outputs produced by said constituent decoder while performing an iteration are approximately equal to said limit.

8. The method of claim 7 wherein outputs approximately equal to said limit are said outputs having a sign corresponding to a sign of said limit and a value approximately equal to a value of said limit.

9. The method of claim 7 wherein one of said constituent decoders applies a soft output Viterbi algorithm.

10. A method of optimizing the performance of an iterating turbo code decoder including a plurality of serial constituent decoders, said method comprising the steps of:

(a) establishing a limit for an output for at least one of said serial constituent decoders;

(b) determining a first number of said outputs approximately equaling said limit produced by a first of said serial constituent decoders while performing an iteration;

(c) determining a second number of said outputs approximately equaling said limit produced by a last of said serial constituent decoders while performing said iteration; and (d) terminating operation of said turbo code decoder when said first and second numbers of said outputs are substantially equal.

11. The method of claim 10 wherein said limit has a sign and where said first and second numbers of said outputs are numbers of said outputs having a sign approximately equal to that of said limit.

12. The method of claim 10 wherein a one of said constituent decoders applies a soft output Viterbi algorithm.

13. An iterating turbo code decoder comprising:

(a) a plurality of serial constituent decoders;

(b) a comparator to compare a plurality of outputs of a constituent decoder to a threshold value for said outputs;

(c) a counter to count a number of said outputs produced by said constituent decoder approximately equaling said threshold value; and (d) a decision unit to terminate operation of said turbo code decoder when said number of said outputs approximately equaling said threshold value is unchanged for successive iterations.

14. The turbo code decoder of claim 13 wherein one of said constituent decoders is a soft output Viterbi algorithm decoder.

15. An iterating turbo code decoder comprising:

(a) a plurality of serial constituent decoders;

(b) a comparator to compare an output of one of said constituent decoders to a threshold value for said output;

(c) a counter to count a first and second number of outputs produced, respectively, by a first one of said serial constituent decoders and a subsequent one of said serial constituent decoders approximately equaling said threshold value; and (d) a decision unit to terminate iteration by said turbo code decoder when said first number of said outputs is approximately equal to said second numbers of said outputs.

16. The turbo code decoder of claim 15 wherein one of said constituent decoders is a soft output Viterbi algorithm decoder.

17. An iterating turbo code decoder comprising:

(a) a plurality of serial constituent decoders;

(b) a comparator to compare an output of one of said serial constituent decoders to a threshold value for said output;

(c) a counter to count a number of said outputs approximately equaling said threshold value;

(d) a memory to store a first, a second, and a third said number of said outputs approximately equaling said threshold value, said outputs produced, respectively, by a last a serial constituent decoder performing a first and a subsequent iteration and a first serial constituent decoder performing said subsequent iteration; and (e) a decision unit to terminate iteration by said turbo code decoder when said first, second, and third numbers of said outputs are approximately equal.

18. The turbo code decoder of claim 17 wherein one of said constituent decoders is a soft output Viterbi algorithm decoder.

* * * * *